US012787612B2

(12) United States Patent
Tu et al.

(10) Patent No.: US 12,787,612 B2
(45) Date of Patent: Nov. 3, 2026

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventors: Qing Tu, Wuhan (CN); Yu Gu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 368 days.

(21) Appl. No.: 18/293,799

(22) PCT Filed: Jan. 17, 2024

(86) PCT No.: PCT/CN2024/072653

§ 371 (c)(1),
(2) Date: Jan. 31, 2024

(87) PCT Pub. No.: WO2025/148091

PCT Pub. Date: Jul. 17, 2025

(65) Prior Publication Data

US 2026/0165004 A1 Jun. 11, 2026

(30) Foreign Application Priority Data

Jan. 11, 2024 (CN) ......................... 202410045517.6

(51) Int. Cl.
*H10K 59/80* (2023.01)
*H10K 59/35* (2023.01)
(Continued)

(52) U.S. Cl.
CPC ......... *H10K 59/879* (2023.02); *H10K 59/352* (2023.02); *H10K 59/353* (2023.02); *H10K 59/40* (2023.02); *H10K 2102/311* (2023.02)

(58) Field of Classification Search
CPC .. H10K 59/879; H10K 59/353; H10K 59/352; H10K 59/40; H10K 2102/311
See application file for complete search history.

(56) References Cited

U.S. PATENT DOCUMENTS

2021/0233970 A1* 7/2021 Wang .................. H10K 59/353
2023/0090498 A1* 3/2023 Kim .................... H10K 59/879
257/40

(Continued)

*Primary Examiner* — Jeff W Natalini
*Assistant Examiner* — Andrew John Zabel
(74) *Attorney, Agent, or Firm* — PV IP PC; Christopher S. Ruprecht; Wei Te Chung

(57) ABSTRACT

The present disclosure provides a display panel and an electronic device. A difference value between a size of a first optical part and a size of a first sub-pixel of the display panel is defined as a first difference value. A difference value between a size of a second optical part and a size of a second sub-pixel of the display panel is defined as a second difference value. The first difference value corresponding to a maximum light-emitting efficiency of the first sub-pixel is defined as a first preset value. The second difference corresponding to a maximum light-emitting efficiency of the second sub-pixel is defined as a second preset value. An absolute value of a difference value between the first difference value and the first preset value is less than an absolute value of a difference value between the second difference value and the second preset value.

17 Claims, 4 Drawing Sheets

(51) Int. Cl.
*H10K 59/40* (2023.01)
*H10K 102/00* (2023.01)

(56) References Cited

U.S. PATENT DOCUMENTS

| | | | | |
|---|---|---|---|---|
| 2023/0105374 | A1* | 4/2023 | Jeong | H10K 59/353<br>257/40 |
| 2023/0115006 | A1* | 4/2023 | Roh | H10F 39/8063<br>348/272 |
| 2023/0200138 | A1* | 6/2023 | Yoon | H10K 59/122<br>257/43 |
| 2023/0413654 | A1* | 12/2023 | Liao | H10K 59/1201 |
| 2024/0295778 | A1* | 9/2024 | Zeng | H10W 90/00 |

* cited by examiner

DISPLAY PANEL AND ELECTRONIC DEVICE

CROSS-REFERENCE TO RELATED APPLICATIONS

This application is a continuation of International Application No. PCT/CN2024/072653, filed on Jan. 17, 2024, which claims priority to and the benefit of Chinese Patent Application No. 202410045517.6, filed on Jan. 11, 2024. The disclosures of the aforementioned applications are incorporated herein by reference in their entireties.

TECHNICAL FIELD

The present disclosure relates to a technical field of display, and in particular to a display panel and an electronic device.

BACKGROUND

With the development of display technology, organic light-emitting diode (OLED) display devices are widely used in various electronic devices. In order to reduce power consumption of the OLED display devices and improve display light-emitting efficiency of the OLED display devices, a micro-lens condensing structure is disposed on a light-emitting side of light-emitting units of the display devices at present to converge light emitted by the light-emitting units to improve light-emitting intensity. However, although the micro-lens condensing structure can improve the light-emitting efficiency of the light-emitting units, it will bring about a problem of turning pink at small viewing angles (such as a 30-degree viewing angle).

SUMMARY

The present disclosure provides a display panel and an electronic device to alleviate a technical problem of turning pink at small viewing angles (such as a 30-degree viewing angle).

In order to solve the problem mentioned above, technical solutions provided by the present disclosure are as follows:

In a first aspect, an embodiment of the present disclosure provides a display panel including:

a substrate;

a plurality of sub-pixels arranged in an array, disposed on a side of the substrate and including a first sub-pixel, a second sub-pixel, and a third sub-pixel, an area of the first sub-pixel is greater than an area of the second sub-pixel and less than an area of the third sub-pixel;

a first optical film layer disposed on a side of the plurality of sub-pixels away from the substrate and provided with optical parts corresponding to the plurality of sub-pixels, first gaps are provided between the adjacent optical parts; and a second optical film layer, disposed on a side of the first optical film layer away from the plurality of sub-pixels and filling in the first gaps, a refractive index of the second optical film layer is less than a refractive index of the first optical film layer;

the optical parts include a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference value corresponding to a maximum light-emitting efficiency of the second sub-pixel is defined as a second preset value; an absolute value of a difference value between the first difference value and the first preset value is less than an absolute value of a difference value between the second difference value and the second preset value.

In a second aspect, an embodiment of the present disclosure provides an electronic device including a display panel. The display panel includes:

a substrate;

a plurality of sub-pixels arranged in an array, disposed on a side of the substrate and including a first sub-pixel, a second sub-pixel, and a third sub-pixel, an area of the first sub-pixel is greater than an area of the second sub-pixel and less than an area of the third sub-pixel;

a first optical film layer disposed on a side of the plurality of sub-pixels away from the substrate and provided with optical parts corresponding to the plurality of sub-pixels, first gaps are provided between the adjacent optical parts; and a second optical film layer disposed on a side of the first optical film layer away from the plurality of sub-pixels and filling in the first gaps, a refractive index of the second optical film layer is less than a refractive index of the first optical film layer;

the optical parts include a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference corresponding to a maximum light-emitting efficiency of the second sub-pixel is defined as a second preset value; an absolute value of a difference value between the first difference value and the first preset value is less than an absolute value of a difference value between the second difference value and the second preset value.

BRIEF DESCRIPTION OF THE DRAWINGS

To describe technical solutions of embodiments of the present disclosure more clearly, following briefly introduces accompanying drawings used in the description of the embodiments of the present disclosure. Apparently, the accompanying drawings described below illustrate merely some exemplary embodiments of the present disclosure, and persons skilled in the art may derive other drawings from the drawings without making creative efforts.

DETAILED DESCRIPTION

Figure 1:
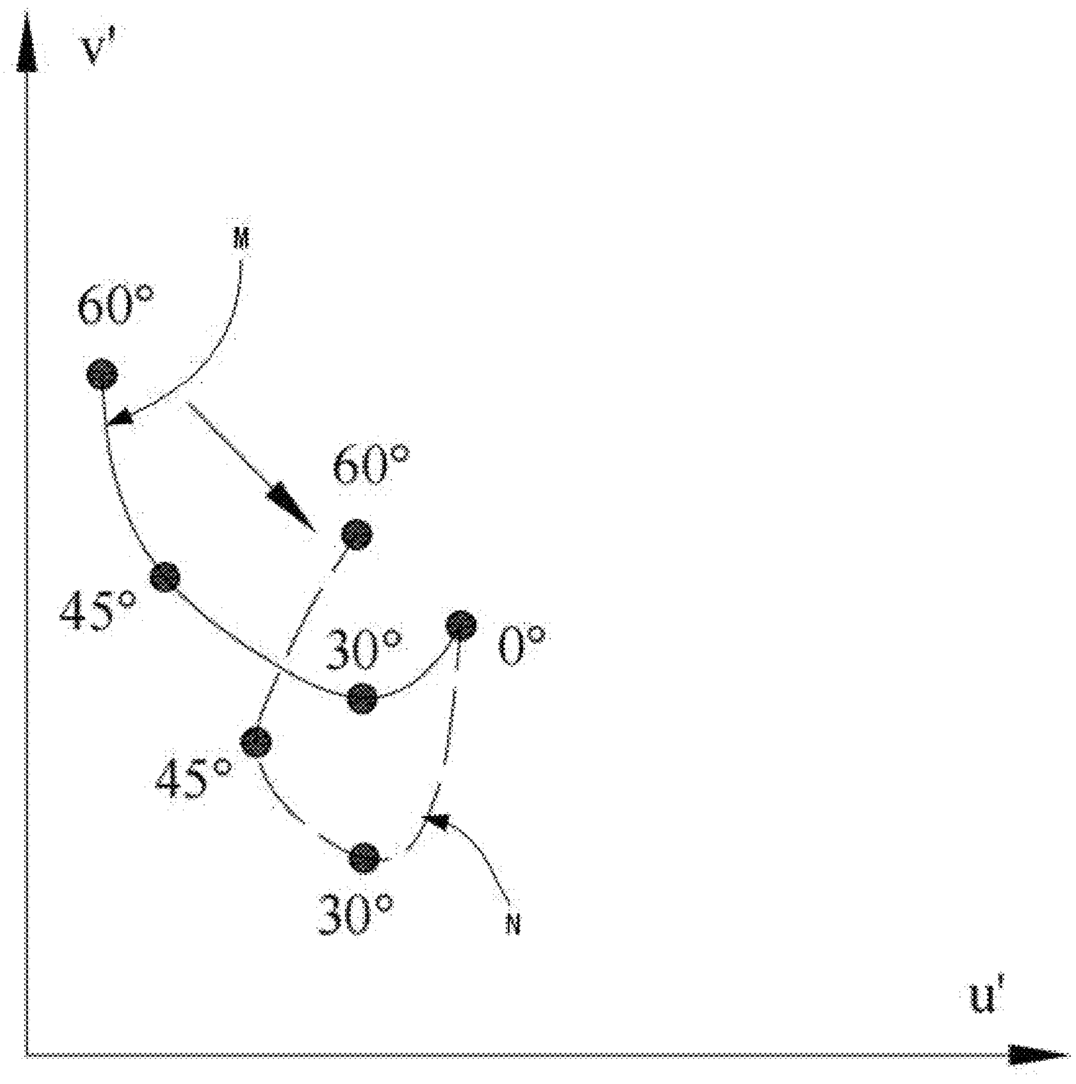
FIG. 1 is a schematic diagram of color shift trajectories of display devices with and without micro-lens in a related art.

The following description of every embodiment with reference to accompanying drawings is used to exemplify a specific embodiment which may be carried out in the present disclosure. Directional terms mentioned in the present disclosure, such as "top", "bottom", "front", "back", "left", "right", "inside", "outside", and "side", etc., are merely used with reference to orientations of the accompanying drawings. Therefore, the used directional terms are intended to illustrate, but not to limit, the present disclosure. In the accompanying drawings, units with similar structures are indicated by a same number. In the drawings, thicknesses of some layers and areas are exaggerated for clarity of understanding and ease of description. The dimension and thickness of each of the elements in the accompanying drawings are arbitrarily shown, and the present disclosure is not limited thereto.

In view of a micro-lens condensing structure disposed on a light-emitting side of light-emitting units of existing display devices will bring about a problem of turning pink at small viewing angles (such as the 30-degree viewing angle), inventors of the present disclosure have found in their research that: referring to FIG. 1, FIG. 1 is a schematic diagram of color shift trajectories of display devices with and without micro-lens in a related art. Curve M in FIG. 1 is a schematic diagram of u'v' trajectory at different viewing angles when the display devices are not provided with the micro-lens. Curve N is a schematic diagram of u'v' trajectory at different viewing angles when the display devices are provided with the micro-lens. From FIG. 1, it can be seen that after the micro-lens are disposed, the u'v' trajectory deviates from a lower right corner under different viewing angles. At this time, the red color has a higher residual brightness, while the green color has a lower residual brightness, resulting in the problem of turning pink at small viewing angles (such as the 30-degree viewing angle).

In order to solve the problem above-mentioned, the present disclosure provides a display panel and an electronic device.

The display panel provided by an embodiment of the present disclosure includes:

- a substrate;
- a plurality of sub-pixels arranged in an array, disposed on a side of the substrate and including a first sub-pixel, a second sub-pixel, and a third sub-pixel, an area of the first sub-pixel is greater than an area of the second sub-pixel and less than an area of the third sub-pixel;
- a first optical film layer, disposed on a side of the plurality of sub-pixels away from the substrate and provided with optical parts corresponding to the plurality of sub-pixels, first gaps are provided between the adjacent optical parts; and
- a second optical film layer, disposed on a side of the first optical film layer away from the plurality of sub-pixels and filling in the first gaps, a refractive index of the second optical film layer is less than a refractive index of the first optical film layer.

The optical parts include a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference value corresponding to a maximum light-emitting efficiency of the second sub-pixel is defined as a second preset value; an absolute value of a difference value between the first difference value and the first preset value is less than an absolute value of a difference value between the second difference value and the second preset value.

In one embodiment, the optical parts further include a third optical part corresponding to the third sub-pixel, a difference value between a size of the third optical part and a size of the third sub-pixel is defined as a third difference value, and the third difference value corresponding to a maximum light-emitting efficiency of the third sub-pixel is defined as a third preset value; an absolute value of a difference value between the third difference value and the third preset value is less than the absolute value of the difference value between the second difference value and the second preset value.

In one embodiment, the absolute value of the difference value between the third difference value and the third preset value is less than or equal to the absolute value of the difference value between the first difference value and the first preset value.

In one embodiment, the third preset value is greater than the second preset value and the first preset value.

In one embodiment, the third preset value is 2 microns, and both the first preset value and the second preset value are 1 micron.

In one embodiment, the absolute value of the difference value between the first difference value and the first preset value ranges from 0 microns to 3 microns; the absolute value of the difference value between the second difference value and the second preset value ranges from 1 micron to 6 microns; the absolute value of the difference value between the third difference value and the third preset value ranges from 0 microns to 3 microns.

In one embodiment, the first difference value ranges from 0 microns to 4 microns, the second difference value ranges from 2 microns to 7 microns, and the third difference value ranges from 0 microns to 4 microns.

In one embodiment, the first sub-pixel is a red sub-pixel, the second sub-pixel is a green sub-pixel, and the third sub-pixel is a blue sub-pixel.

In one embodiment, the first optical film layer further includes a plurality of supporting parts located in the first gaps, and the second optical film layer located in the first gaps further covers the supporting parts; the display panel further includes a touching structure disposed on the supporting parts.

In one embodiment, the first optical film layer includes a first sub-layer and a second sub-layer located on a side of the first sub-layer away from the plurality of sub-pixels; the first sub-layer includes first sub-parts of the supporting parts, and the second sub-layer includes second sub-parts of the supporting parts; the touching structure includes a touching electrode and a bridge electrode, one of the touching electrode and the bridge electrode is located between the first sub-layer and the second sub-layer, and the other one is located on a side of the second sub-layer away from the first sub-layer.

In one embodiment, each of the optical parts includes an upper surface, a lower surface opposite to the upper surface, and a plurality of side surfaces connected between the upper surface and the lower surface; the upper surface is located on a side of the lower surface away from the plurality of sub-pixels, and the second optical film layer covers the upper surface and the plurality of side surfaces of the optical parts; wherein an orthographic projection of the upper surface of the optical parts on the substrate is within an orthographic projection of the lower surface on the substrate.

The electronic device provided by an embodiment of the present disclosure includes the display panel of one of the foregoing embodiments.

In the display panel and electronic device provided by the present disclosure, the display panel includes the substrate, the plurality of sub-pixels, and the plurality of sub-pixels corresponding to the sub-pixels. The optical parts include the first optical part corresponding to the first sub-pixel and the second optical part corresponding to the second sub-pixel. The difference value between the size of the first optical part and the size of the first sub-pixel is defined as the first difference value. The difference value between the size of the second optical part and the size of the second sub-pixel is defined as the second difference value. The first difference value corresponding to the maximum light-emitting efficiency of the first sub-pixel is defined as the first preset value. The second difference value corresponding to the maximum light-emitting efficiency of the second sub-pixel is defined as the second preset value. The absolute value of the difference value between the first difference value and the first preset value is less than the absolute value of the difference value between the second difference value and the second preset value. In this way, a light-emitting efficiency of the first sub-pixel is closer to the maximum light-emitting efficiency thereof to accelerate attenuation of the light-emitting brightness of the first sub-pixel, light-emitting efficiency of the second sub-pixel is away from the maximum light-emitting efficiency thereof to slow down attenuation of light-emitting brightness of the second sub-pixel, thereby improving the problem of turning pink at small viewing angles (such as the 30-degree viewing angle).

The display panel and the electronic device of the present disclosure will be described in detail below with reference to accompanying drawings and specific embodiments.

Figure 2:
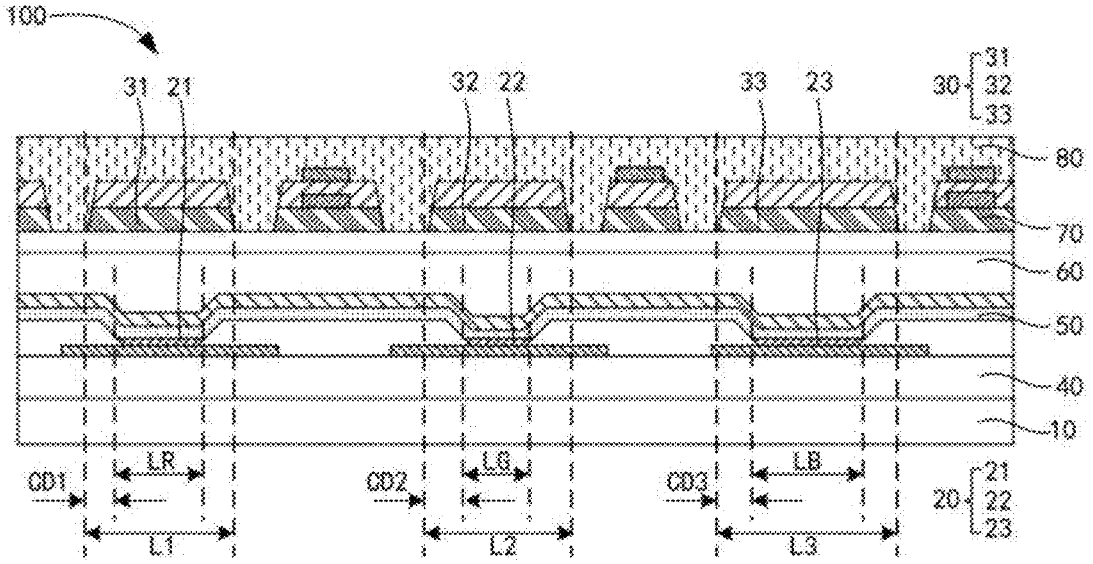
FIG. 2 is a partial cross-sectional structural schematic diagram of a display panel provided by an embodiment of the present disclosure.
Figure 3:
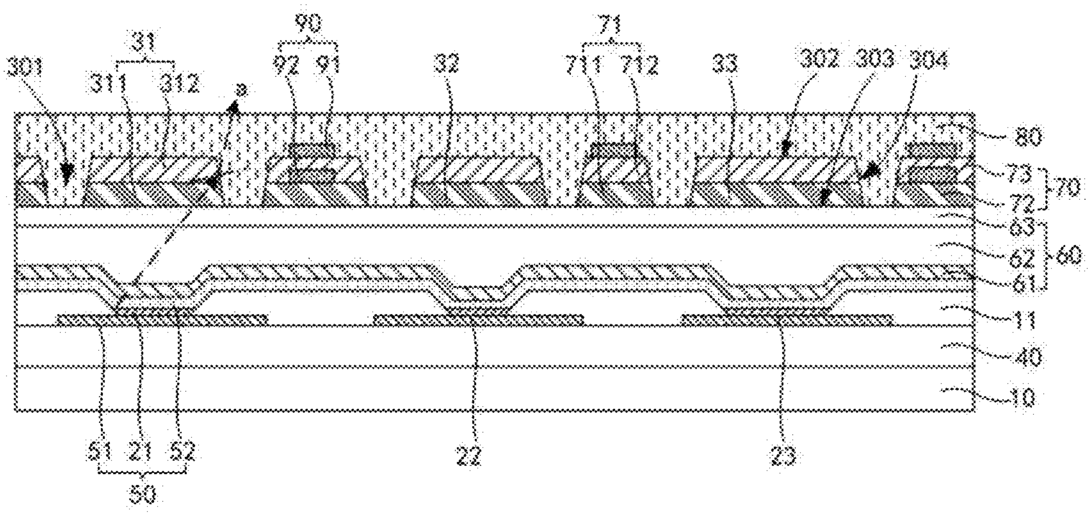
FIG. 3 is a detailed schematic diagram of the display panel in FIG. 2.
Figure 4:
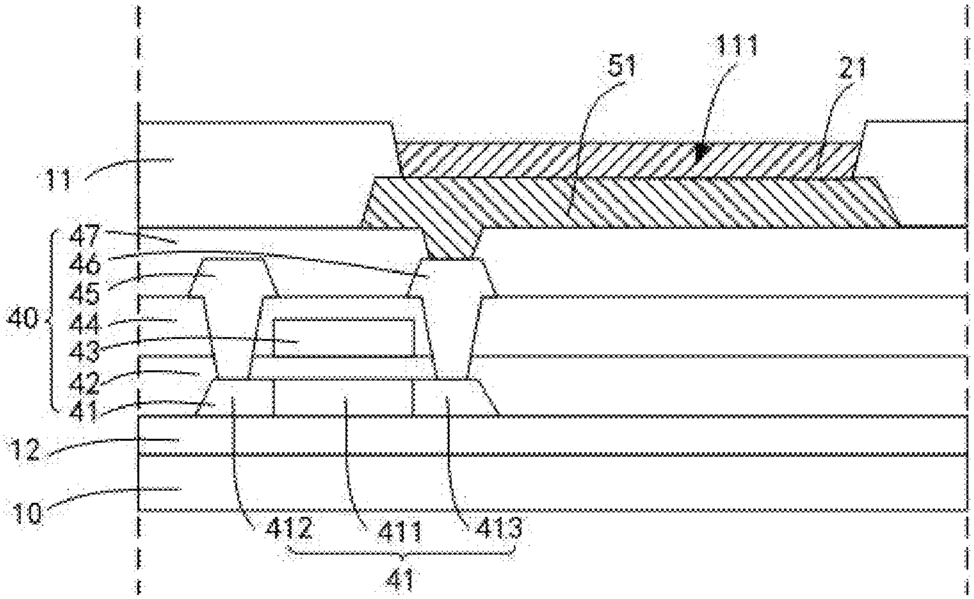
FIG. 4 is a partial detailed schematic diagram of a driving circuit layer in FIG. 2.
Figure 5:
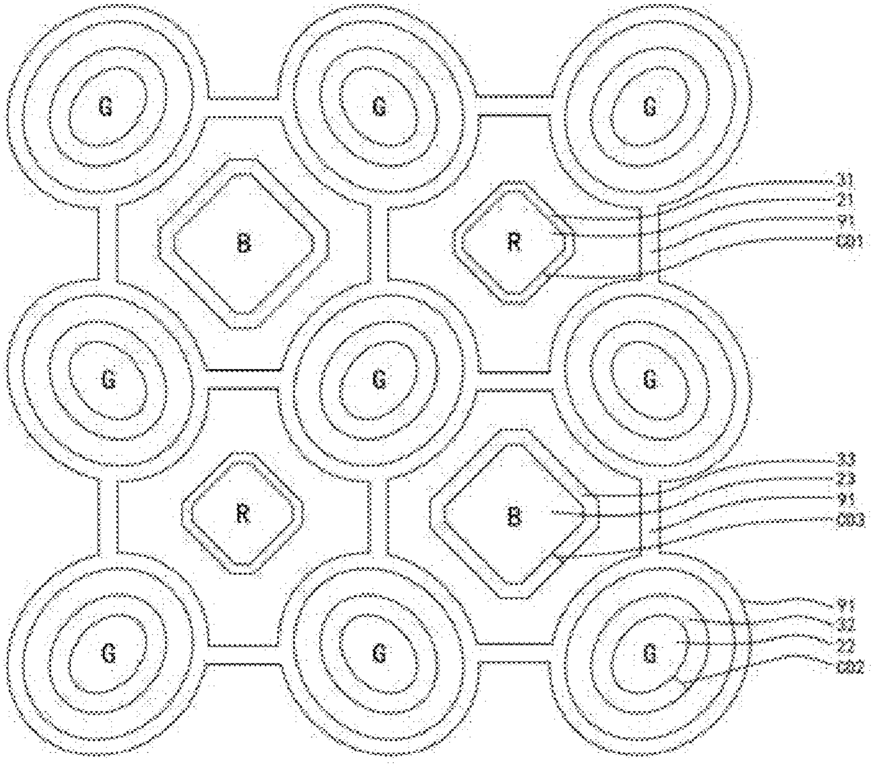
FIG. 5 is a partial planar structural schematic diagram of the display panel provided by an embodiment of the present disclosure.
Figure 6:
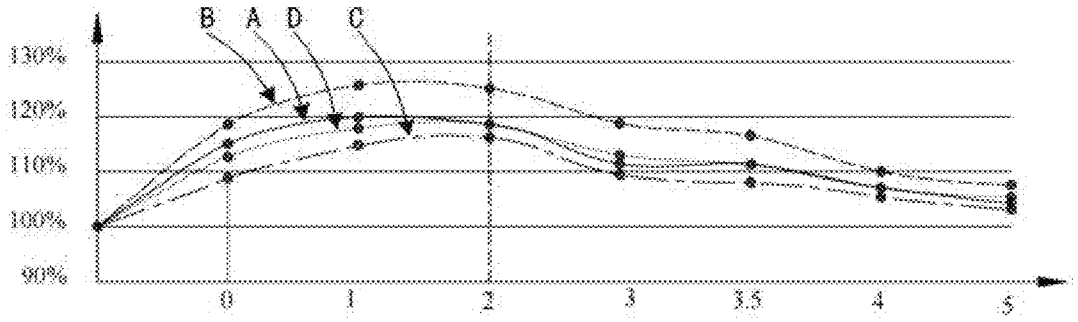
FIG. 6 is a schematic diagram showing a corresponding relationship between a light-emitting efficiency enhancement ratio of sub-pixels of the display panel and a difference value between the sub-pixels and optical parts according to an embodiment of the present disclosure.
Figure 7:
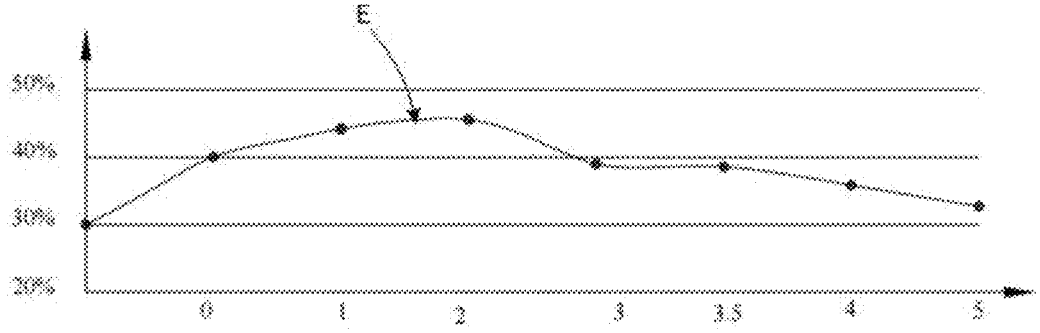
FIG. 7 is a schematic diagram showing a corresponding relationship between brightness attenuation of the sub-pixels of the display panel and the difference value between the sub-pixels and the optical parts according to an embodiment of the present disclosure.

Referring to FIG. 2 to FIG. 7, FIG. 2 is a partial cross-sectional structural schematic diagram of a display panel provided by an embodiment of the present disclosure. FIG. 3 is a detailed schematic diagram of the display panel in FIG. 2. FIG. 4 is a partial detailed schematic diagram of a driving circuit layer in FIG. 2. FIG. 5 is a partial planar structural schematic diagram of the display panel provided by an embodiment of the present disclosure. FIG. 6 is a schematic diagram showing a corresponding relationship between a light-emitting efficiency enhancement ratio of sub-pixels of the display panel and a difference value between the sub-pixels and optical parts according to an embodiment of the present disclosure. FIG. 7 is a schematic diagram showing a corresponding relationship between brightness attenuation of the sub-pixels of the display panel and the difference value between the sub-pixels and the optical parts according to an embodiment of the present disclosure. The display panel 100 includes an organic light-emitting diode (OLED) display panel, etc., which can realize flexible display, and further realize bending and folding.

Referring to FIG. 2, the display panel 100 includes a substrate 10, a plurality of sub-pixels 20, a first optical film layer 70, and a second optical film layer 80. The plurality of sub-pixels 20 arranged in an array are disposed on a side of the substrate 10. The plurality of sub-pixels 20 include a first sub-pixel 21, a second sub-pixel 22, and a third sub-pixel 23. An area of the first sub-pixel 21 is greater than an area of the second sub-pixel 22 and less than an area of the third sub-pixel 23. For example, the first sub-pixel 21 is a red sub-pixel, the second sub-pixel 22 is a green sub-pixel, and the third sub-pixel 23 is a blue sub-pixel. The sub-pixels with different colors emit light with different colors. The red sub-pixel emits red light, the green sub-pixel emits green light, and the blue sub-pixel emits blue light.

The first optical film layer 70 is disposed on a side of the plurality of sub-pixels 20 away from the substrate 10. The first optical film layer 70 is provided with optical parts 30 corresponding to the plurality of sub-pixels 20. First gaps 301 are provided between the adjacent optical parts 30. The second optical film layer 80 is disposed on a side of the first optical film layer 70 away from the plurality of sub-pixels 20 and filling in the first gaps 301. A refractive index of the second optical film layer 80 is less than a refractive index of the first optical film layer 70.

The refractive index of the first optical film layer 70 ranges from 1.5 to 1.9. The refractive index of the second optical film layer 80 ranges from 1.3 to 1.6. For example, in this embodiment, the refractive index of the first optical film layer 70 is 1.4, and the refractive index of the second optical film layer 80 is 1.7. Optionally, a material of the first optical film layer 70 includes an inorganic material with high transmittance such as silicon oxide or silicon nitride. The second optical film layer 80 is an organic material with high transmittance such as pressure sensitive adhesive (PSA).

The plurality of optical parts 30 include a first optical part 31 and a second optical part 32. The first optical part 31 corresponds to the first sub-pixel 21. The second optical part 32 corresponds to the second sub-pixel 22. A difference value between a size L1 of the first optical part 31 and a size LR of the first sub-pixel 21 is defined as a first difference value CD1. A difference value between a size L2 of the second optical part 32 and a size LG of the second sub-pixel 22 is defined as a second difference value CD2. The first difference value corresponding to a maximum light-emitting efficiency of the first sub-pixel 21 is defined as a first preset value. The second difference value corresponding to a maximum light-emitting efficiency of the second sub-pixel 22 is defined as a second preset value. An absolute value of a difference value between the first difference value CD1 and the first preset value is less than an absolute value of a difference value between the second difference value CD2 and the second preset value. In this way, the light-emitting efficiency of the first sub-pixel 21 is closer to the maximum light-emitting efficiency thereof to accelerate light-emitting brightness attenuation of the first sub-pixel 21, and the light-emitting efficiency of the second sub-pixel 22 is away from the maximum light-emitting efficiency thereof to slow down light-emitting brightness attenuation of the second sub-pixel 22, so that a light-emitting brightness ratio of the first sub-pixel 21 decreases and a light-emitting brightness ratio of the second sub-pixel 22 increases in the mixed light emitted by the first sub-pixel 21 and the second sub-pixel 22, thereby improving the problem of turning pink at small viewing angles (such as the 30-degree viewing angle) in the existing display devices. It should be noted that the light-emitting efficiency mentioned above refers to a light-emitting efficiency at the light-emitting pixels at a positive viewing angle of the display panel. After the light emitted by the light-emitting pixels (such as the first sub-pixel 21, the second sub-pixel 22, etc.) passing through the first optical film layer 70 and the second optical film layer 80, the light emitted by the light-emitting sub-pixels may be converged at the positive viewing angle, thereby improving the light-emitting efficiency at the positive viewing angle. When the optical parts and the light-emitting sub-pixels corresponding to the light-emitting parts are designed together, it is not that the larger the size difference between the optical parts and the light-emitting sub-pixels, the higher the light-emitting efficiency at the positive viewing angle. A law is that with the increase of the size difference, the light-emitting efficiency at the positive viewing angle first increases to a maximum value and then decreases.

It should be noted that the difference value between the size of the optical parts 30 and the size of the corresponding sub-pixels 20 refers to a distance between an outer contour of an orthogonal projection of the optical parts 30 on the substrate 10 and an outer contour of an orthogonal projection of the sub-pixels 20 on the substrate 10. The size of the optical parts 30 can be characterized by a key size of the orthographic projection of the optical parts 30 on the substrate 10. The key size of the orthographic projection depends on a specific shape of the orthographic projection. For example, when the shape of the orthographic projection of the optical parts 30 is a circle, the key size of the orthographic projection can be characterized by a diameter of the circle. When the shape of the orthographic projection of the optical parts 30 is a square, the key size of the orthographic projection can be characterized by a diagonal length of the square. Similarly, the size of the sub-pixels 20 can be defined by referring to the size of the optical parts 30 and will not be described here.

The difference value between the size of the optical parts 30 and the size of the sub-pixels 20 corresponding to the optical parts 30 refers to the difference value obtained by subtracting the size of the corresponding sub-pixels 20 from the size of the optical parts 30. The difference value may be a positive number, a negative number, or 0. When the difference value is the positive number, it indicates that the size of the optical parts 30 is greater than the size of the corresponding sub-pixels 20. When the difference value is the negative number, it indicates that the size of the optical parts 30 is less than the size of the corresponding sub-pixels 20. When the difference value is 0, it indicates that the size of the optical parts 30 is equal to the size of the corresponding sub-pixels 20.

In one embodiment, the optical parts 30 further include a third optical part 33 corresponding to the third sub-pixel 23. A difference value between the size L3 of the third optical part 33 and a size LB of the third sub-pixel 23 is defined as a third difference value CD3. The third difference value corresponding to a maximum light-emitting efficiency of the third sub-pixel 23 is defined as a third preset value. An absolute value of the difference value between the third difference value CD3 and the third preset value is less than the absolute value of the difference value between the second difference value CD2 and the second preset value. The absolute value of the difference value between the third difference value CD3 and the third preset value is less than or equal to the absolute value of the difference value between the first difference value CD1 and the first preset value. In this way, a light-emitting efficiency of the third sub-pixel 23 is closer to the maximum light-emitting efficiency thereof to accelerate the light-emitting brightness attenuation of the third sub-pixel 23, the curve N in FIG. 1 can be moved to an upper left, thereby further improving the problem of turning pink at small viewing angles (such as the 30-degree viewing angle).

An overall structure of the display panel 100 will be described in detail below.

Referring to FIG. 2, FIG. 3, and FIG. 4, the display panel 100 further includes a driving circuit layer 40 disposed on the side of the substrate 10, a light-emitting functional layer 50 disposed on a side of the driving circuit layer 40 away from the substrate 10, and an encapsulation layer 60 disposed on the light-emitting functional layer 50. The optical parts 30 are disposed on a side of the encapsulation layer 60 away from the light-emitting functional layer 50.

A material of the substrate 10 includes flexible materials such as polyimide (PI). A flexible display panel 100 with special properties such as bending and curling can be manufactured by using the flexible materials as the substrate 10. For example, the flexible display panel 100 can be used to manufacture multiple curved surfaces to achieve a higher screen ratio.

Referring to FIG. 4, the driving circuit layer 40 is disposed on the side of the substrate 10. Optionally, a buffer layer 12 may be disposed between the substrate 10 and the driving circuit layer 40. A material of the buffer layer 12 may include inorganic materials such as silicon oxide (SiOx), silicon nitride (SiNx), silicon oxynitride (SiON), etc. The buffer layer 12 can prevent unwanted impurities or pollutants (such as moisture, oxygen, etc.) from spreading from the substrate 10 to devices that may be damaged by these impurities or pollutants. At the same time, the buffer layer 12 can further provide a flat top surface.

The driving circuit layer 40 includes an active layer 41, a gate insulating layer 42, a gate 43, an interlayer insulating layer 44, a source 45, a drain 46, and a planarization layer 47 stacked on the buffer layer 12. The active layer 41 is disposed on a side of the buffer layer 12 away from the substrate 10. The active layer 41 includes a channel area 411, a source area 412, and a drain area 413. The source area 412 and the drain area 413 are located at both sides of the channel area 411.

The gate insulating layer 42 covers the active layer 41 and the buffer layer 12. The gate 43 is disposed on a side of the gate insulating layer 42 away from the active layer 41 and corresponds to the channel area 411. The interlayer insulating layer 44 covers the gate 43 and the gate insulating layer 42.

The source 45 and the drain 46 are disposed on a side of the interlayer insulating layer 44 away from the gate 43. The source 45 and the drain 46 are respectively connected to the source area 412 and the drain area 413 of the active layer 41 through via holes of the interlayer insulating layer 44 and the gate insulating layer 42. The planarization layer 47 covers the source 45, the drain 46, and the interlayer insulating layer 44 to provide a flat surface for the driving circuit layer 40.

Referring to FIG. 3 and FIG. 4, the light-emitting functional layer 50 is disposed on the driving circuit layer 40. The light-emitting functional layer 50 includes a first electrode 51, a second electrode 52, and light-emitting units located between the first electrode 51 and the second electrode 52. The first electrode 51 is an anode, and the second electrode 52 is a cathode. The first electrode 51 is an independent electrode pattern, and the second electrode 52 is disposed on an entire surface. The first electrode 51 is disposed on a surface of the planarization layer 47 and is connected to the source 45 or the drain 46 through a via hole of the planarization layer 47, as shown in FIG. 4, the first electrode 51 is connected to the drain 46.

The display panel 100 further includes a pixel definition layer 11 covering the first electrode 51 and the planarization layer 47 and is provided with an opening 111 at a position corresponding to the first electrode 51. The opening 111 exposes part of the first electrode 51 to define an area where the sub-pixels 20 are disposed. The area corresponding to the opening 111 is also a light-emitting area of the sub-pixels 20. For example, as shown in FIG. 4, taking the first sub-pixel 21 as an example, the opening 111 exposes part of the first electrode 51 to define an area of disposing the first sub-pixel 21, and the area corresponding to the opening 111 is also a light-emitting area of the first sub-pixel 21. The light-emitting units are disposed in the opening 111 and cover the first electrode 51. The second electrode 52 covers the light-emitting units and the pixel defining layer 11. The light-emitting units emit light under the joint action of the first electrode 51 and the second electrode 52.

It should be noted that each of the sub-pixels 20 in this present disclosure is one light-emitting unit. That is, the sub-pixels 20 are characterized by the light-emitting units in this present disclosure. A size of the light-emitting units is the size of the corresponding sub-pixels 20 and is limited by the size of the opening 111 of the pixel definition layer 11. The light-emitting units are formed by light-emitting materials printed in the opening 111 of the pixel-defining layer 11. The light-emitting materials of different colors form the light-emitting units with different colors.

Continuing to refer to FIG. 3, in order to protect the light-emitting units from failure caused by water and oxygen intrusion, the display panel 100 further includes the encapsulation layer 60 disposed on the side of the light-emitting functional layer 50 away from the driving circuit layer 40. Optionally, the encapsulation layer 60 may be thin film encapsulated. For example, the encapsulation layer 60 may be a stacked structure formed by three thin films sequentially stacked including a first inorganic encapsulation layer 61, an organic encapsulation layer 62, and a second inorganic encapsulation layer 63 or a stacked structure of more layers.

Continuing to refer to FIG. 2 and FIG. 3, the first optical film layer 70 is disposed on the side of the encapsulation layer 60 away from the light-emitting functional layer 50. The second optical film layer 80 is disposed on the side of the first optical film layer 70 away from the encapsulation layer 60. The first optical film layer 70 includes the plurality of optical parts 30 corresponding to the sub-pixels 20. Each of the optical parts 30 includes an upper surface 302, a lower surface 303 opposite to the upper surface 302, and a plurality of side surfaces 304 connected to the upper surface 302 and the lower surface 303. The upper surface 302 is located on a side of the lower surface 303 away from the sub-pixels 20. The second optical film layer 80 covers the upper surface 302 and the side surfaces 304 of the optical parts 30. An orthographic projection of the upper surface 302 on the substrate 10 is within an orthographic projection of the lower surface 303 on the substrate 10. A gap is provided between an outer contour of the orthogonal projection of the upper surface 302 on the substrate 10 and an outer contour of the orthogonal projection of the lower surface 303 on the substrate 10. That is, an area of the orthographic projection of the upper surface 302 is less than an area of the orthographic projection of the lower surface 303. In short, for the optical parts 30, an area of the upper surface 302 is less than an area of the lower surface 303. A longitudinal cross-sectional shape of the optical parts 30 is trapezoidal.

Light emitted from the sub-pixels 20 may be converged by the optical parts 30 to improve the light-emitting efficiency. Taking the first optical part 31 as an example, referring to FIG. 3, when light a emitted by the first sub-pixel 21 passes through the first optical part 31, the refractive index of the first optical part 31 is greater than the refractive index of the second optical film layer 80, so that an optical path of the light a at an interface between the first optical part 31 and the second optical film layer 80 is changed, and the light a passing through the first optical part 31 moves closer to a central light-emitting area of the first sub-pixel 21 to improve the light-emitting efficiency.

Optionally, the first optical film layer 70 further includes a plurality of supporting parts 71 located in the first gaps 301, and the second optical film layer 80 located in the first gaps 301 further covers the supporting parts 71. The display panel further includes a touching structure 90 to achieve a touching function of the display panel 100. The touching structure 90 is disposed on the supporting parts 71.

Specifically, the first optical film layer 70 includes a first sub-layer 72 and a second sub-layer 73 located on a side of the first sub-layer 72 away from the plurality of sub-pixels 20. The first sub-layer 72 includes first sub-parts 711 of the supporting parts 71, and the second sub-layer 73 includes second sub-parts 712 of the supporting parts 71. The touching structure 90 includes a touching electrode 91 and a bridge electrode 92. One of the touching electrode 91 and the bridge electrode 92 is located between the first sub-layer 72 and the second sub-layer 73, and the other one is located on a side of the second sub-layer 73 away from the first sub-layer 72. This embodiment is illustrated by taking an example that the bridge electrode 92 is located between the first sub-layer 72 and the second sub-layer 73, and the touching electrode 91 is located on the side of the second sub-layer 73 away from the first sub-layer 72. Accordingly, the optical parts 30 are also formed by the first sub-layer 72 and the second sub-layer 73. Taking the first optical part 31 as an example, the first sub-layer 72 further includes a third sub-part 311 of the first optical part 31, and the second sub-layer 73 further includes a fourth sub-part 312 of the first optical part 31.

In this way, the optical parts 30 are integrated with the touching structure 90, and the optical parts 30 and the touching structure 90 share part of the film layers, so that the optical parts 30 can be formed by a thinner high-refractive material, and a thickness of the display panel 100 can be reduced. Compared with the micro-lens structure formed by leveling a high-refractive material with higher thickness in the related art, the optical parts 30 formed in this present disclosure is obviously more conducive to realizing the flexible or foldable display panel 100.

Differential designs of the optical parts 30 corresponding to different sub-pixels 20 will be further described in detail below with reference to FIG. 2, FIG. 5, FIG. 6, and FIG. 7.

In one embodiment, referring to FIG. 2, the difference value between the size L1 of the first optical part 31 and the size LR of the first sub-pixel 21 is defined as the first difference CD1. The difference value between the size L2 of the second optical part 32 and the size LG of the second sub-pixel 22 is defined as the second difference CD2. The difference value between the size L3 of the third optical part 33 and the size LB of the third sub-pixel 23 is defined as the third difference CD3. The first difference value corresponding to the maximum light-emitting efficiency of the first sub-pixel 21 is defined as the first preset value. The second difference value corresponding to the maximum light-emitting efficiency of the second sub-pixel 22 is defined as the second preset value. The third difference value corresponding to the maximum light-emitting efficiency of the third sub-pixel 23 is defined as the third preset value. The absolute value of the difference value between the first difference value CD1 and the first preset value is less than the absolute value of the difference value between the second difference value CD2 and the second preset value. The absolute value of the difference value between the third difference value CD3 and the third preset value is less than the absolute value of the difference value between the second difference value CD2 and the second preset value. Optionally, the absolute value of the difference value between the third difference CD3 and the third preset value is less than or equal to the absolute value of the difference value between the first difference CD1 and the first preset value.

Referring to FIG. 6 and FIG. 7, FIG. 6 and FIG. 7 are simulation data provided by the embodiment of the present disclosure. In FIG. 6, the abscissa indicates size difference values between the optical parts 30 and the corresponding sub-pixels 20. The unit is microns. The ordinate indicates the light-emitting efficiency enhancement ratio. Curves A, B, and C in the figure indicate changing tendencies of the light-emitting efficiency enhancement ratio of the first sub-pixel 21, the second sub-pixel 22, and the third sub-pixel 23 with the size difference values between the optical parts 30 and the corresponding sub-pixels 20, respectively. Curve D indicates a trend graph of the light-emitting efficiency enhancement ratio of white light mixed by the light-emitting of three sub-pixels 20 with different light-emitting colors. In FIG. 7, the abscissa indicates the difference value between the size of the optical parts 30 and the size of the corresponding sub-pixels 20. The unit is microns. The ordinate indicates a light brightness attenuation ratio. Curve E in the figure indicates a trend graph of the light brightness attenuation ratio of white light mixed with the light emitted by the three sub-pixels 20 with different light-emitting colors. By comparing FIG. 6 and FIG. 7, it can be seen that the changing trend of the light-emitting efficiency enhancement ratio is the same as the changing trend of the light brightness attenuation ratio, that is, they both increase first and then decrease with the increase of the size difference value between the optical parts 30 and the corresponding sub-pixels 20.

Continuing to refer to FIG. 6, it can be seen from FIG. 6 that, for the first sub-pixel 21, when the difference value between the size of the first optical part 31 and the size of the first sub-pixel 21 is 1 micron, the light-emitting efficiency of the first sub-pixel 21 is the highest. For the second sub-pixel 22, when the difference value between the size of the second optical part 32 and the size of the second sub-pixel 22 is 1 micron, the light-emitting efficiency of the second sub-pixel 22 is the highest. For the third sub-pixel 23, when the difference value between the size of the third optical part 33 and the third sub-pixel 23 is 2 microns, the light-emitting efficiency of the third sub-pixel 23 is the highest. That is, the third preset value is greater than the second preset value and is further greater than the first preset value. Optionally, the third preset value is 2 microns, and both the first preset value and the second preset value are 1 micron.

Optionally, the absolute value of the difference value between the first difference value CD1 and the first preset value ranges from 0 microns to 3 microns. For example, the absolute value of the difference value between the first difference value CD1 and the first preset value is greater than or equal to 0 microns and less than or equal to 3 microns, e.g. 0 microns, 0.2 microns, 0.4 microns, 0.5 microns, 0.6 microns, 0.7 microns, 0.8 microns, 0.9 microns, 1 micron, 1.5 microns, 1.8 microns, 2 microns, 2.3 microns, 2.7 microns, 3 microns, etc. The absolute value of the difference value between the second difference value CD2 and the second preset value ranges from 1 micron to 6 microns. For example, the absolute value of the difference value between the second difference value CD1 and the second preset value is greater than or equal to 1 micron and less than or equal to 6 microns, e.g. 1 micron, 1.5 microns, 2 microns, 2.5 microns, 3 microns, 3.2 microns, 3.4 microns, 3.8 microns, 4 microns, 4.2 microns, 4.6 microns, 4.8 microns, 5 microns, 5.5 microns, 6 microns, 6.5 microns, 7 microns, etc. The absolute value of the difference value between the third difference CD3 and the third preset value ranges from 0 microns to 3 microns. For example, the absolute value of the difference value between the third difference value CD1 and the third preset value is greater than or equal to 0 microns and less than or equal to 3 microns, e.g. 0 microns, 0.2 microns, 0.4 microns, 0.5 microns, 0.6 microns, 0.7 microns, 0.8 microns, 0.9 microns, 1 micron, 1.5 microns, 1.8 microns, 2 microns, 2.3 microns, 2.7 microns, 3 microns, etc.

In one embodiment, referring to FIG. 5, the first sub-pixel 21 is the red sub-pixel R, the second sub-pixel 22 is the green sub-pixel G, and the third sub-pixel 23 is the blue sub-pixel B. The area of the first sub-pixel 21 is greater than the area of the second sub-pixel 22, and further less than the area of the third sub-pixel 23. The first difference value CD1 ranges from 0 microns to 4 microns. For example, the first difference value CD1 between the first optical part 31 and the first sub-pixel 21 is greater than or equal to 0 microns and less than or equal to 4 microns, e.g. 0 microns, 0.2 microns, 0.4 microns, 0.6 microns, 0.8 microns, 0.9 microns, 1 micron, 1.1 microns, 1.2 microns, 1.3 microns, 1.4 microns, 1.5 microns, 1.6 microns, 1.7 microns, 1.8 microns, 1.9 microns, 2 microns, 2.3 microns, 2.6 microns, 2.9 microns, 3 microns, 3.5 microns, 3.8 microns, 4 microns, etc. The second difference value CD2 ranges from 2 microns to 7 microns. That is, the second difference value CD2 between the second optical part 32 and the second sub-pixel 22 is greater than or equal to 2 microns and less than or equal to 7 microns. For example, the second difference value CD2 is 2 microns, 2.3 microns, 2.5 microns, 2.8 microns, 3 microns, 3.1 microns, 3.2 microns, 3.3 microns, 3.5 microns, 3.6 microns, 3.7 microns, 3.8 microns, 3.9 microns, 4 microns, 4.3 microns, 4.5 microns, 4.8 microns, 5 microns, 5.5 microns, 6 microns, 6.5 microns, 7 microns, etc. The third difference value CD3 ranges from 0 microns to 4 microns. That is, the third difference value CD3 between the third optical part 33 and the third sub-pixel 23 is greater than or equal to 0 microns and less than or equal to 4 microns, e.g. 0 microns, 0.2 microns, 0.4 microns, 0.6 microns, 0.8 microns, 0.9 microns, 1 micron, 1.1 microns, 1.2 microns, 1.3 microns, 1.4 microns, 1.5 microns, 1.6 microns, 1.7 microns, 1.8 microns, 1.9 microns, 2 microns, 2.3 microns, 2.6 microns, 2.9 microns, 3 microns, 3.5 microns, 3.8 microns, 4 microns, etc. Optionally, the first difference value CD1 may be greater than the second difference value CD2 or less than the second difference value CD2. The third difference value CD3 may be greater than the second difference value CD2 or less than the second difference value CD2. The first difference CD1 may be greater than the third difference CD3 or less than the third difference CD3. For example, in FIG. 5 of this embodiment, the first difference value CD1 is less than the second difference value CD2, the third difference value CD3 is further less than the second difference value CD2, and the first difference value CD1 is further less than the third difference value CD3.

Based on the same inventive concept, the embodiment of the present disclosure further provides an electronic device including the display panel 100 of one of the above embodiments. The electronic device can be a mobile phone, a flat panel, a television, a wearable electronic device, etc.

According to the Embodiment

In the display panel and electronic device provided by the present disclosure, the display panel includes the substrate, the plurality of sub-pixels, and the plurality of sub-pixels corresponding to the sub-pixels. The optical parts include the first optical part corresponding to the first sub-pixel and the second optical part corresponding to the second sub-pixel. The difference value between the size of the first optical part and the size of the first sub-pixel is defined as the first difference value. The difference value between the size of the second optical part and the size of the second sub-pixel is defined as the second difference value. The first difference value corresponding to the maximum light-emitting efficiency of the first sub-pixel is defined as the first preset value. The second difference value corresponding to the maximum light-emitting efficiency of the second sub-pixel is defined as the second preset value. The absolute value of the difference value between the first difference value and the first preset value is less than the absolute value of the difference value between the second difference value and the second preset value. In this way, a light-emitting efficiency of the first sub-pixel is closer to the maximum light-emitting efficiency thereof to accelerate attenuation of the light-emitting brightness of the first sub-pixel, a light-emitting efficiency of the second sub-pixel is away from the maximum light-emitting efficiency thereof to slow down attenuation of light-emitting brightness of the second sub-pixel, thereby improving the problem of turning pink at small viewing angles (such as the 30-degree viewing angle).

In the foregoing embodiments, the description of each of the embodiments has respective focuses. For a part that is not described in detail in an embodiment, reference may be made to relevant descriptions in other embodiments. Details are not further described herein.

The embodiments of the present disclosure are described in detail above. The principle and implementations of the present disclosure are described in this specification by using specific examples. The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A display panel, comprising:

a substrate;

a plurality of sub-pixels arranged in an array, disposed on a side of the substrate and comprising a first sub-pixel, a second sub-pixel, and a third sub-pixel, wherein an area of the first sub-pixel is greater than an area of the second sub-pixel and less than an area of the third sub-pixel;

a first optical film layer, disposed on a side of the plurality of sub-pixels away from the substrate and provided with optical parts corresponding to the plurality of sub-pixels, wherein first gaps are provided between the adjacent optical parts; and a second optical film layer, disposed on a side of the first optical film layer away from the plurality of sub-pixels and filling in the first gaps, wherein a refractive index of the second optical film layer is less than a refractive index of the first optical film layer;

wherein the optical parts comprise a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference value corresponding to a maximum light-emitting efficiency of the second sub-pixel is defined as a second preset value; an absolute value of a difference value between the first difference value and the first preset value is less than an absolute value of a difference value between the second difference value and the second preset value;

wherein the optical parts further comprise a third optical part corresponding to the third sub-pixel, a difference value between a size of the third optical part and a size of the third sub-pixel is defined as a third difference value, and the third difference value corresponding to a maximum light-emitting efficiency of the third sub-pixel is defined as a third preset value; an absolute value of a difference value between the third difference value and the third preset value is less than the absolute value of the difference value between the second difference value and the second preset value; and wherein the absolute value of the difference value between the first difference value and the first preset value ranges from 0 microns to 3 microns; the absolute value of the difference value between the second difference value and the second preset value ranges from 1 micron to 6 microns; the absolute value of the difference value between the third difference value and the third preset value ranges from 0 microns to 3 microns.

2. The display panel according to claim 1, wherein the absolute value of the difference value between the third difference value and the third preset value is less than or equal to the absolute value of the difference value between the first difference value and the first preset value.

3. The display panel according to claim 2, wherein the third preset value is greater than the second preset value and the first preset value.

4. The display panel according to claim 3, wherein the third preset value is 2 microns, and both the first preset value and the second preset value are 1 micron.

5. The display panel according to claim 1, wherein the first difference value ranges from 0 microns to 4 microns, the second difference value ranges from 2 microns to 7 microns, and the third difference value ranges from 0 microns to 4 microns.

6. The display panel according to claim 1, wherein the first sub-pixel is a red sub-pixel, the second sub-pixel is a green sub-pixel, and the third sub-pixel is a blue sub-pixel.

7. The display panel according to claim 6, wherein each of the optical parts comprises an upper surface, a lower surface opposite to the upper surface, and a plurality of side surfaces connected between the upper surface and the lower surface; the upper surface is located on a side of the lower surface away from the plurality of sub-pixels, and the second optical film layer covers the upper surface and the plurality of side surfaces of the optical parts; wherein an orthographic projection of the upper surface of the optical parts on the substrate is within an orthographic projection of the lower surface on the substrate.

8. The display panel according to claim 1, wherein the first optical film layer further comprises a plurality of supporting parts located in the first gaps, and the second optical film layer located in the first gaps further covers the supporting parts; the display panel further comprises a touching structure disposed on the supporting parts.

9. The display panel according to claim 8, wherein the first optical film layer comprises a first sub-layer and a second sub-layer located on a side of the first sub-layer away from the plurality of sub-pixels; the first sub-layer comprises first sub-parts of the supporting parts, and the second sub-layer comprises second sub-parts of the supporting parts; the touching structure comprises a touching electrode and a bridge electrode, one of the touching electrode and the bridge electrode is located between the first sub-layer and the second sub-layer, and the other one is located on a side of the second sub-layer away from the first sub-layer.

10. An electronic device comprising a display panel, the display panel comprising:

a substrate;

a plurality of sub-pixels arranged in an array, disposed on a side of the substrate and comprising a first sub-pixel, a second sub-pixel, and a third sub-pixel, wherein an area of the first sub-pixel is greater than an area of the second sub-pixel and less than an area of the third sub-pixel;

a first optical film layer, disposed on a side of the plurality of sub-pixels away from the substrate and provided with optical parts corresponding to the plurality of sub-pixels, wherein first gaps are provided between the adjacent optical parts; and a second optical film layer, disposed on a side of the first optical film layer away from the plurality of sub-pixels and filling in the first gaps, wherein a refractive index of the second optical film layer is less than a refractive index of the first optical film layer;

wherein the optical parts comprise a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference value corresponding to a maximum light-emitting efficiency of the second sub-pixel is defined as a second preset value; an absolute value of a difference value between the first difference value and the first preset value is less than an absolute value of a difference value between the second difference value and the second preset value;

wherein the optical parts further comprise a third optical part corresponding to the third sub-pixel, a difference value between a size of the third optical part and a size of the third sub-pixel is defined as a third difference value, and the third difference value corresponding to a maximum light-emitting efficiency of the third sub-pixel is defined as a third preset value; an absolute value of a difference value between the third difference value and the third preset value is less than the absolute value of the difference value between the second difference value and the second preset value; and wherein the optical parts further comprise a third optical part corresponding to the third sub-pixel, a difference value between a size of the third optical part and a size of the third sub-pixel is defined as a third difference value, and the third difference value corresponding to a maximum light-emitting efficiency of the third sub-pixel is defined as a third preset value; an absolute value of a difference value between the third difference value and the third preset value is less than the absolute value of the difference value between the second difference value and the second preset value.

11. The electronic device according to claim 10, wherein the absolute value of the difference value between the third difference value and the third preset value is less than or equal to the absolute value of the difference value between the first difference value and the first preset value.

12. The electronic device according to claim 11, wherein the third preset value is greater than the second preset value and the first preset value.

13. The electronic device according to claim 12, wherein the third preset value is 2 microns, and both the first preset value and the second preset value are 1 micron.

14. The electronic device according to claim 10, wherein the first difference value ranges from 0 microns to 4 microns, the second difference value ranges from 2 microns to 7 microns, and the third difference value ranges from 0 microns to 4 microns.

15. The electronic device according to claim 10, wherein the first optical film layer further comprises a plurality of supporting parts located in the first gaps, and the second optical film layer located in the first gaps further covers the supporting parts; the display panel further comprises a touching structure disposed on the supporting parts.

16. The electronic device according to claim 15, wherein the first optical film layer comprises a first sub-layer and a second sub-layer located on a side of the first sub-layer away from the plurality of sub-pixels; the first sub-layer comprises first sub-parts of the supporting parts, and the second sub-layer comprises second sub-parts of the supporting parts; the touching structure comprises a touching electrode and a bridge electrode, one of the touching electrode and the bridge electrode is located between the first sub-layer and the second sub-layer, and the other one is located on a side of the second sub-layer away from the first sub-layer.

17. A display panel, comprising:

a substrate;

a plurality of sub-pixels arranged in an array, disposed on a side of the substrate and comprising a first sub-pixel, a second sub-pixel, and a third sub-pixel, wherein an area of the first sub-pixel is greater than an area of the second sub-pixel and less than an area of the third sub-pixel;

a first optical film layer, disposed on a side of the plurality of sub-pixels away from the substrate and provided with optical parts corresponding to the plurality of sub-pixels, wherein first gaps are provided between the adjacent optical parts; and a second optical film layer, disposed on a side of the first optical film layer away from the plurality of sub-pixels and filling in the first gaps, wherein a refractive index of the second optical film layer is less than a refractive index of the first optical film layer;

wherein the optical parts comprise a first optical part corresponding to the first sub-pixel and a second optical part corresponding to the second sub-pixel, a difference value between a size of the first optical part and a size of the first sub-pixel is defined as a first difference value, and a difference value between a size of the second optical part and a size of the second sub-pixel is defined as a second difference value; the first difference value corresponding to a maximum light-emitting efficiency of the first sub-pixel is defined as a first preset value, and the second difference value corresponding to a maximum light-emitting efficiency of the second sub-pixel is defined as a second preset value; an absolute value of a difference value between the first difference value and the first preset value is less than an absolute value of a difference value between the second difference value and the second preset value;

wherein the first optical film layer further comprises a plurality of supporting parts located in the first gaps, and the second optical film layer located in the first gaps further covers the supporting parts; the display panel further comprises a touching structure disposed on the supporting parts; and wherein the first optical film layer comprises a first sub-layer and a second sub-layer located on a side of the first sub-layer away from the plurality of sub-pixels; the first sub-layer comprises first sub-parts of the supporting parts, and the second sub-layer comprises second sub-parts of the supporting parts; the touching structure comprises a touching electrode and a bridge electrode, one of the touching electrode and the bridge electrode is located between the first sub-layer and the second sub-layer, and the other one is located on a side of the second sub-layer away from the first sub-layer.

* * * * *